United States Patent
Takamura

(10) Patent No.: US 7,125,307 B2
(45) Date of Patent: Oct. 24, 2006

(54) METHOD OF BONDING SEAL CAPS TO A SUBSTRATE OF ORGANIC ELECTROLUMINESCENT ELEMENTS

(75) Inventor: Makoto Takamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 197 days.

(21) Appl. No.: 10/620,222

(22) Filed: Jul. 15, 2003

(65) Prior Publication Data

US 2004/0007974 A1    Jan. 15, 2004

(30) Foreign Application Priority Data

Jul. 15, 2002   (JP)   ............................. 2002-206020
Aug. 8, 2002    (JP)   ............................. 2002-231519

(51) Int. Cl.
*H05B 33/10*    (2006.01)
*H01L 51/56*    (2006.01)

(52) U.S. Cl. ......................................... 445/25; 445/24
(58) Field of Classification Search .............. 445/24, 445/25; 313/512; 257/98–100
See application file for complete search history.

(56) References Cited

U.S. PATENT DOCUMENTS

| | | | | |
|---|---|---|---|---|
| 3,976,906 A | * | 8/1976 | Shattuck | 313/500 |
| 6,049,167 A | * | 4/2000 | Onitsuka et al. | 313/512 |
| 6,080,031 A | * | 6/2000 | Rogers et al. | 445/25 |
| 6,424,092 B1 | * | 7/2002 | Odake et al. | 315/169.3 |
| 6,794,815 B1 | * | 9/2004 | Lee et al. | 313/504 |

FOREIGN PATENT DOCUMENTS

| | | | | |
|---|---|---|---|---|
| JP | 11224774 A | * | 8/1999 | |
| JP | 2000223267 A | * | 8/2000 | |
| JP | 2000243555 A | * | 9/2000 | |
| JP | 2002050471 A | * | 2/2002 | |
| JP | 2004030978 A | * | 1/2004 | |

\* cited by examiner

*Primary Examiner*—Mariceli Santiago
(74) *Attorney, Agent, or Firm*—Hedman & Costigan PC; James V. Costigan

(57) ABSTRACT

A method of manufacturing an organic electroluminescent display element includes the steps of forming a plurality of organic electroluminescent elements on top of a transparent substrate, bonding seal caps provided with electronic circuits to the transparent substrate so as to seal each of the organic electroluminescent elements, and then cutting the transparent substrate around each of the organic electroluminescent elements to form organic electroluminescent display elements.

3 Claims, 6 Drawing Sheets

METHOD OF BONDING SEAL CAPS TO A SUBSTRATE OF ORGANIC ELECTROLUMINESCENT ELEMENTS

BACKGROUND OF THE INVENTION

1. Field of the Invention

The present invention is related to a method of manufacturing an organic electroluminescent (hereafter "electroluminescent" is abbreviated as EL) display element, an organic EL display element, and a portable information terminal equipped with an organic EL display element manufactured by such manufacturing method.

2. Description of the Prior Art

It is well known that organic EL display elements which utilize EL emitted light phenomenon is used in the display portions of various information terminals. A prior art method of manufacturing an organic EL display element is shown in FIGS. 1(a)~1(d). FIGS. 1(a)~1(d) are drawings for describing the manufacturing process of a prior art organic EL display element, wherein 51 represents a transparent substrate, 52 represents organic EL elements, 53 represents a seal cap, 54 represents a driving circuit, and 55 represents an organic EL display element.

First, a plurality of organic EL elements 52 is formed on top of a transparent substrate 51 (FIG. 1(a)). Although not shown in the drawings, the organic EL elements 52 are elements which have a transparent electrode, an organic EL layer and a metal electrode layer laminated onto the top of the transparent glass substrate 51. In order to process the organic EL elements 52, the transparent substrate 51 on which the plurality of organic EL elements 52 has been placed is cut to form individual organic EL elements (FIG. 1(b)). Because the organic EL layers of the organic EL elements are weakened by water, each of the organic EL elements 52 cut away into separate elements is sealed by a seal cap 53 (FIG. 1(c)) to prevent water in the air from flowing in. After sealing with the seal cap 53 has been carried out, a driving circuit 54 which drives the organic EL element is mounted by COG (Circuit on Glass) to the top of the seal cap to complete the organic EL display element 55 (FIG. 1(d)).

In this way, in the prior art, in the case where the driving circuit is mounted to the seal cap, after the organic EL element is sealed with the seal cap, because COG mounting is carried out, the rigidity of the seal cap needs to be increased. Consequently, the thickness of the seal cap becomes thick, whereby the thickness of the organic EL display element also becomes thick.

Further, because the organic EL elements 52 formed on top of the transparent substrate 51 are cut away to form individual elements, such elements need to be taken out from the vacuum chamber. In the process of covering the organic EL element 52 with the seal cap 53, because helium or the like is filled inside the seal cap, the organic EL element 52 needs to be returned again to an airproof chamber. Consequently, the manufacturing process becomes complicated.

SUMMARY OF THE INVENTION

In order to solve the problems of the prior art described above, it is an object of the present invention to simplify the manufacturing process, and manufacture a thin organic EL display element.

In order to achieve the object stated above, a first invention of the present application is a method of manufacturing an organic EL display element which includes the steps of forming a plurality of organic EL elements on top of a transparent substrate, bonding seal caps provided with electronic circuits to the transparent substrate so as to seal each of the organic EL elements, and then cutting the transparent substrate around each of the organic EL elements to form organic EL display elements.

The first invention of the present application makes it possible to simplify the manufacturing process of the organic EL display element. In this regard, an organic EL element is an element which has an anode, an organic EL layer and a cathode laminated on top of a transparent substrate. An organic EL display element is a display element in which a seal cap seals the transparent substrate on which the organic EL element is laminated.

A second invention of the present application is the method of manufacturing an organic EL display element of the first invention described above, wherein an ultraviolet curing resin seal is used in the bonding of the seal caps to the transparent substrate, seal glass transparent to ultraviolet light is used in the seal caps, and the bonding of the seal caps to the transparent substrate is carried out by shining ultraviolet light on the ultraviolet curing resin seal from the seal caps side.

This second invention makes it possible to bond the seal caps to the transparent substrate easily in a short time.

A third invention of the present application is the method of manufacturing an organic EL display element of the first or second invention described above, wherein an ultraviolet curing resin seal having anisotropic conductive particles mixed therein is used in the bonding of the seal caps to the transparent substrate, and ultraviolet light is shone on the ultraviolet curing resin seal after the seal caps and the transparent substrate are compressed so that the anisotropic conductive particles have a compressibility of 10~50%, and preferably 20~40%.

The anisotropic conductive particles are constructed with cores made of PVA (polyvinyl alcohol) and intermediate shells made of nickel, and are coated with outside shells made of gold. The third invention makes it possible to bond the seal caps to the transparent substrate easily in a short time, and simultaneously connect the electronic circuits provided on the seal caps to the organic EL elements on top of the transparent substrate easily in a short time.

A fourth invention of the present application is an organic EL display element which includes a seal cap provided with an electronic circuit, a transparent substrate on which the seal cap is bonded by an ultraviolet curing resin seal having anisotropic conductive particles mixed therein, and an organic EL element laminated on top of the transparent substrate inside the seal cap.

The fourth invention makes it possible to obtain an organic EL display element which makes it possible to bond the seal caps to the transparent substrate easily in a short time, and simultaneously connect the electronic circuits provided on the seal caps to the organic EL elements on top of the transparent substrate easily in a short time.

A fifth invention of the present application is a portable information terminal equipped with an organic EL display element manufactured by the method of manufacturing an organic EL display element of any one of the first~third inventions described above or a portable information terminal equipped an organic EL display element of the forth invention described above.

The portable information terminal includes information terminals having a display portion such as a portable telephone, a PDA (Personal Digital Assistant) and the like.

The fifth invention of the present application makes it possible to make the portable information terminal thin, and enlarge the display portion thereof.

Further, each of these structures can be combined in all possible ways.

DETAILED DESCRIPTION OF THE PREFERRED EMBODIMENTS

The method of manufacturing an organic EL display element of the present invention is shown in FIGS. 2(a)–2(d). FIGS. 2(a)–2(d) are drawings for describing the manufacturing process of the organic EL display element of the present invention, wherein 11 represents a seal cap, 12 represents a circuit pattern, 13 represents an electronic circuit, 14 represents a transparent substrate, and 15 represents an organic EL display element. The transparent substrate includes a glass substrate, a flexible substrate, a color filter, and a substrate formed with a color conversion film or a dielectric multilayered film. In the case of a color filter, the characteristics thereof can be adjusted to make it possible to optimize efficiency and color purity. In the case of color conversion, EL emission light is absorbed, and then light from a fluorescent material of a fluorescent conversion film is emitted, whereby color conversion of the emission light color is carried out. In the case of a dielectric multilayered film, instead of a color filter, light having a prescribed wavelength is passed.

Figure 1A:
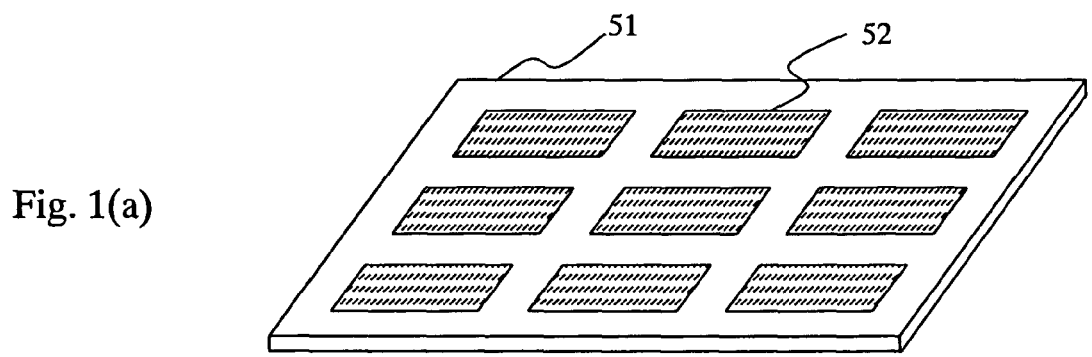
FIGS. 1(a)–1(d) are process drawings for describing the manufacturing process of a prior art organic EL display element.
Figure 1B:
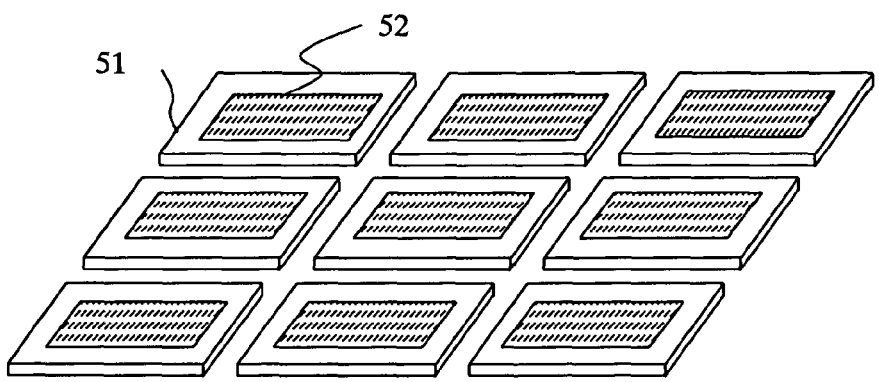
Figure 1C:
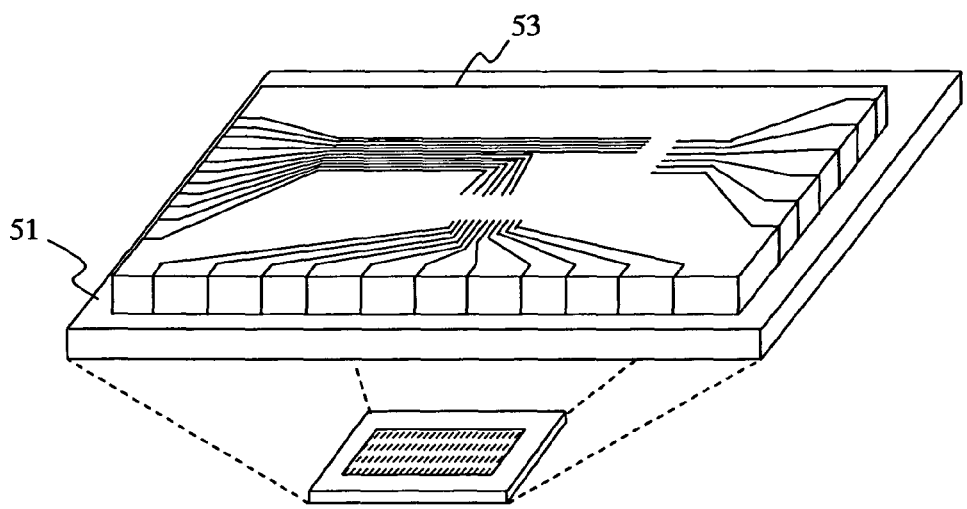
Figure 1D:
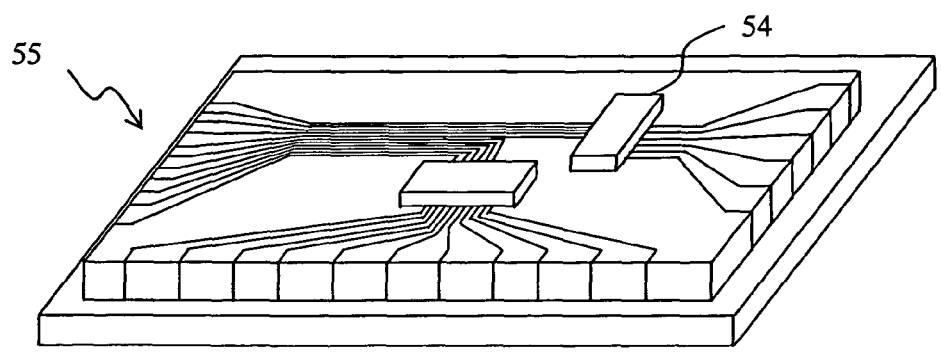
Figure 2A:
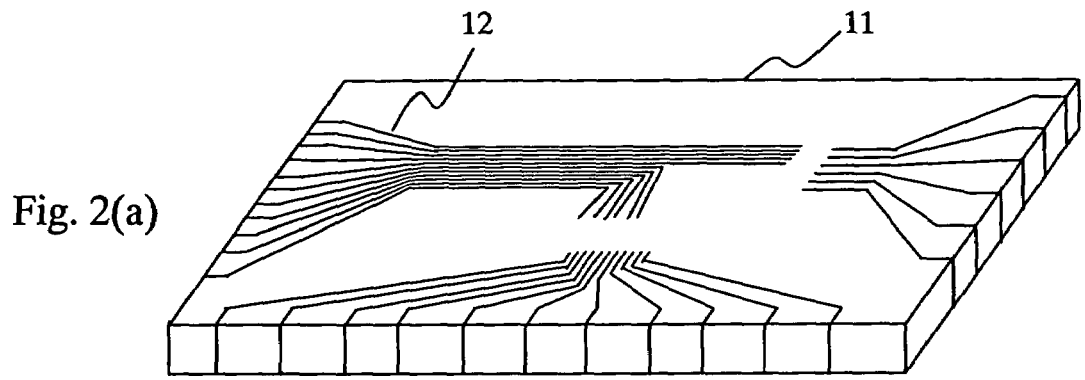
FIGS. 2(a)–2(d) are process drawings for describing the manufacturing process of an organic EL display element of the present invention.

First, a circuit pattern 12 is formed on a seal cap 11 (FIG. 2(a)). When the seal cap is made from a glass having a relatively low melting point such as soda glass, boron silicate glass or the like, a circuit pattern is formed by a thin film capable of low temperature processing and photolithography. When the seal cap is made from a glass having a relatively high melting point such as crystallized glass, quartz glass or the like, because high temperature processing can be carried out, a circuit pattern is formed by a transfer method or a thick film print formed by screen printing gold, silver or silver palladium. A connection from the circuit pattern on the top of the seal cap to the circuit pattern on the bottom may be made by side wiring of the seal cap or by through hole wiring.

Figure 2B:
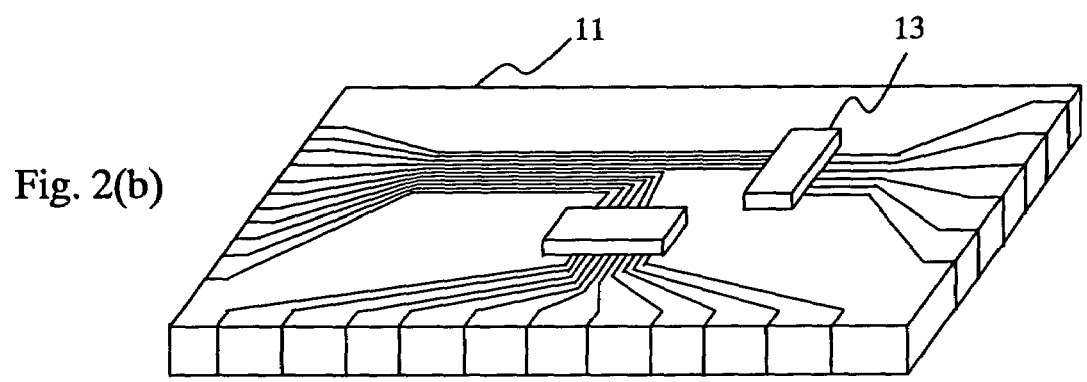
Figure 2C:
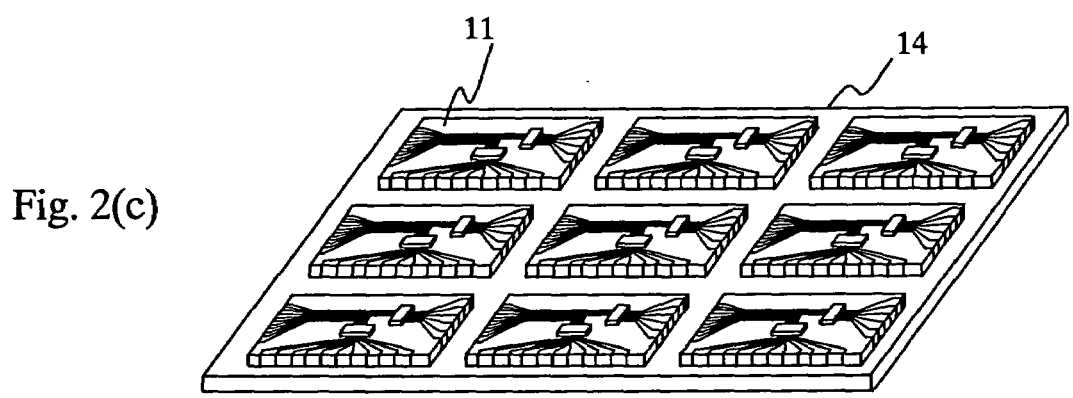
Figure 2D:
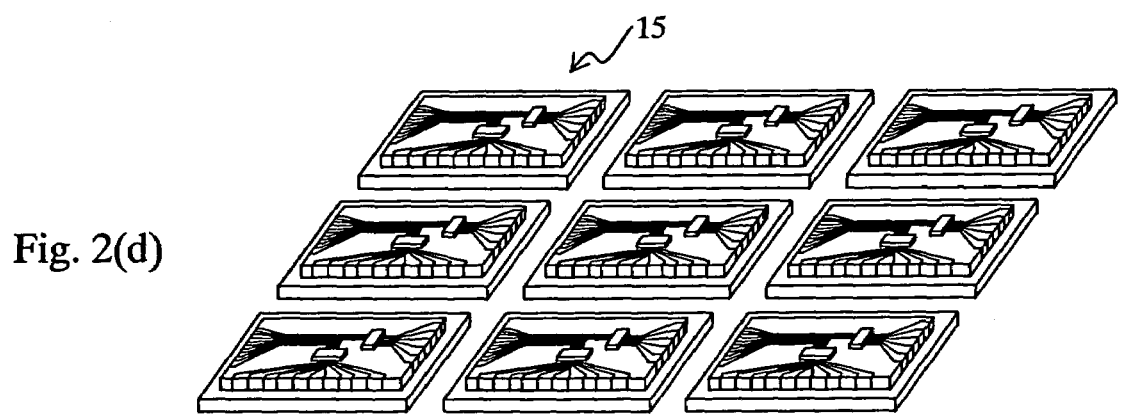

Next, an electronic circuit 13 is mounted to the top of the seal cap by COG using an anisotropic conductive film or an anisotropic conductive paste (FIG. 2(b)). The electronic circuit 13 includes a driving circuit for driving the organic EL element, a control circuit for controlling the driving circuit, chip capacitors and chip resistors. The driving circuit has a scanning electrode driving function which drives a scanning electrode, and a data electrode driving function which drives a data electrode. The control circuit has a memory function which stores data to be displayed on the display, and a control function which controls the driving circuit. After the electronic circuit 13 is mounted, a protection resin is applied to the surface of the seal cap 11 to stabilize the connection between the electronic circuit 13 and the seal cap 11. Before bonding the sealing cap 11 on which the electronic circuit 13 is mounted, the seal cap 11 is connected to a probe corresponding to all the input and output pins, and an operation test is carried out. By carrying out this operation test, defective items are removed in advance.

A plurality of organic EL elements (not shown in the drawings) is formed in advance on a transparent substrate 14. Seal caps 11 which have passed the operation test are bonded to each organic EL element on the transparent substrate 14 (FIG. 2(c)). In the bonding of the seal caps 11 to the transparent substrate 14, each seal cap 11 may be individually positioned with respect to the transparent substrate 14, and then bonded to the transparent substrate 14. Further, a plurality of seal caps 11 may be assembled in a set arrangement which is then positioned with respect to the transparent substrate 14, whereafter the seal caps 11 are bonded to the transparent substrate 14. In the case where positioning on the transparent substrate 14 is carried out for each seal cap 11, the positioning for each seal cap 11 is preferably carried out by putting alignment markers near the organic EL elements (not shown in the drawings) on the transparent substrate 14. In the case where a plurality of seal caps 11 are assembled in a set arrangement which is then positioned with respect to the transparent substrate 14, the positioning of such assembled arrangement is preferably carried out by putting alignment markers on both ends of the transparent substrate 14. Finally, the transparent substrate 14 on which the seal caps 11 are bonded is cut around each of the organic EL elements to form completed organic EL display elements 15 (FIG. 2(d)).

In accordance with the manufacturing method of the present invention, because the organic EL display elements are cut away after the seal caps have been bonded to the transparent substrate, all the process steps from the forming of the organic EL elements on top of the transparent substrate to the bonding of the seal caps can be carried out inside a vacuum chamber or an airproof chamber, and this makes it possible to simplify the manufacturing process. Further, because it is possible to carry out an operation test before the seal cap on which the electronic circuit is mounted is bonded to the transparent substrate, it is possible to use only nondefective items, and this makes it possible to improve the manufacturing yield of organic EL display elements. Furthermore, because the electronic circuit is mounted to the seal cap by COG before the seal cap is bonded to the transparent substrate, the electronic circuit can be mounted with the underside of the seal cap serving as a mounting stage, and this makes it possible to use thin glass for the seal cap.

Now, because the organic EL display element according to the manufacturing method of the present invention can use thin glass, the organic EL display element can be made thin. Further, because the electronic circuit is mounted to the seal cap, there is no need for a flexible substrate having an electronic circuit mounted thereon, and if a flexible substrate for connection with an external circuit is connected to the seal cap, it is possible to obtain a so-called frameless organic EL display element.

Figure 3A:
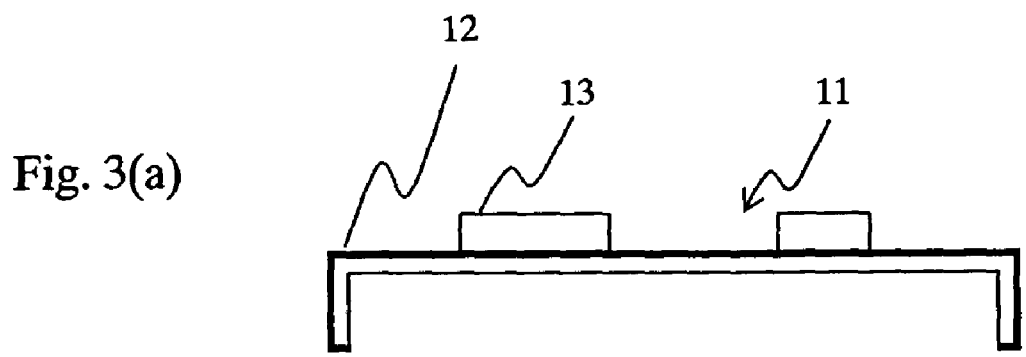
FIGS. 3(a)–3(c) are process drawings for describing a method of bonding a seal cap to a transparent substrate in the manufacturing method of the organic EL display element of the present invention.
Figure 3B:
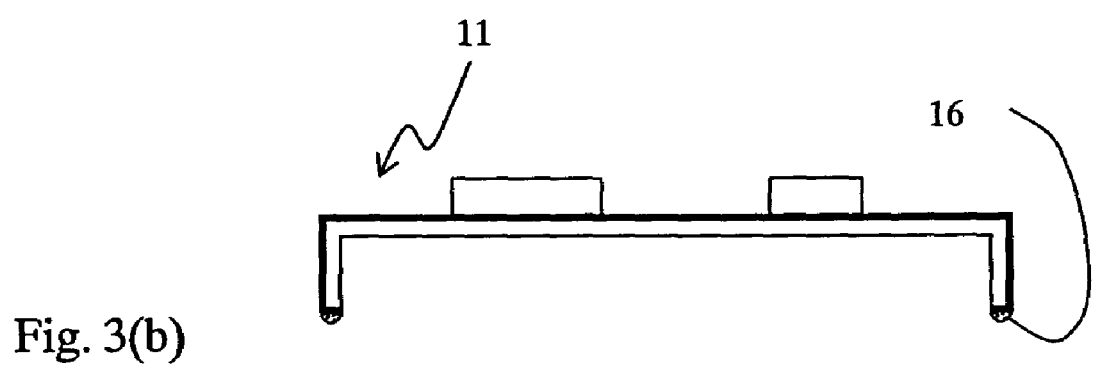
Figure 3B:
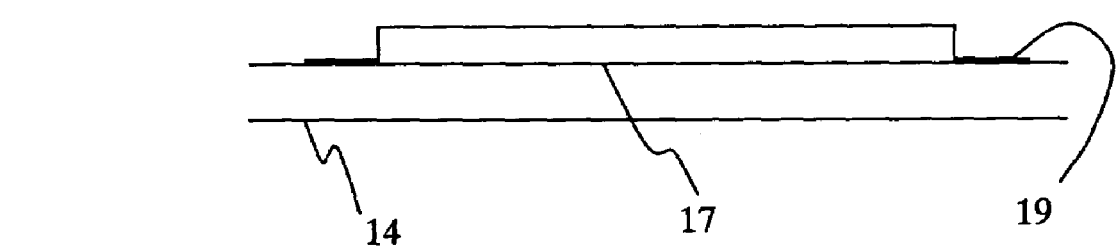
Figure 3C:
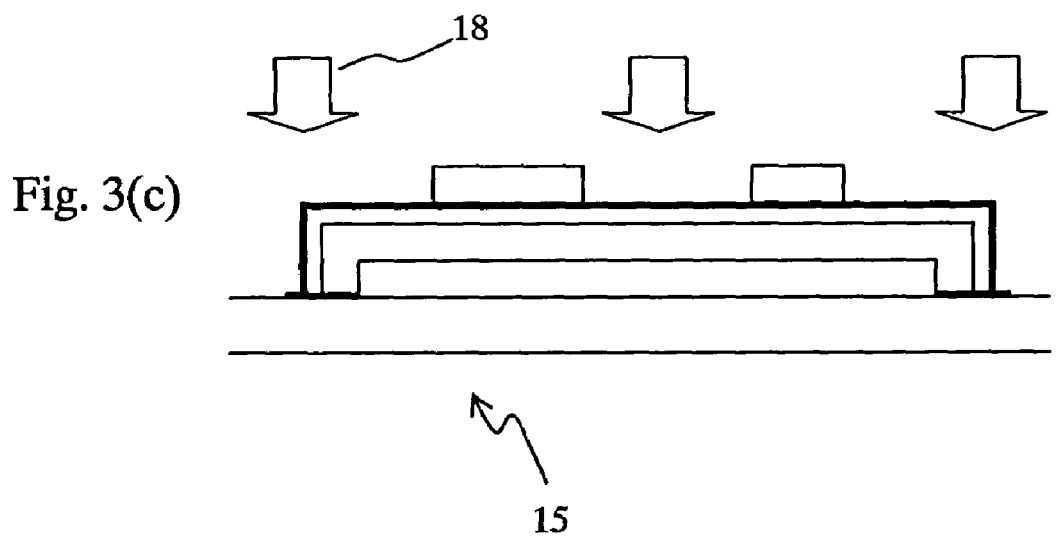

Next, a description will be given for the method of bonding the seal cap to the transparent substrate. FIGS. 3(a)–3(c) are process drawings for describing a method of bonding the seal cap to the transparent substrate, wherein 11 represents a seal cap, 12 represents a circuit pattern, 13 represents an electronic circuit, 14 represents a transparent substrate, 15 represents an organic EL display element, 16 represents an ultraviolet curing resin seal, 17 represents an organic EL element, 18 represents ultraviolet light, and 19 represents electrode terminals. The electrode terminals 19 are connected to the electrodes of the organic EL element 17, and may be made from the same material as the electrodes of the organic EL element 17 or a different material. Preferably, the material should have low resistance and stability against outside air. The electrode terminals may be connected to electrodes corresponding to the electrode terminals, or connected by forming a bus line between the electrodes.

A circuit pattern 12 is formed on the surface of a seal cap 11, and then an electronic circuit 13 is mounted thereto (FIG. 3(a)). An ultraviolet curing resin seal 16 is applied to the portions where the seal cap 11 makes contact with a transparent substrate 14 (FIG. 3(b)). The ultraviolet curing resin seal 16 may be applied to the seal cap 11 or the transparent substrate 14, or to both the seal cap 11 and the transparent substrate 14. A plurality of organic EL elements 17 is already formed on the transparent substrate 14, and seal caps 11 are bonded to the transparent substrate 14 so as to seal each of the organic EL elements 17 (FIG. 3(c)). For the sake of simplicity, only one organic EL element is shown in FIGS. 3(b) and 3(c). Ultraviolet light 18 is then shone onto the ultraviolet curing resin seal 16 to complete the bonding. When ultraviolet light is shone from the seal cap 11 side, a material transparent to ultraviolet light is selected for the seal cap 11. When ultraviolet light is shone from the transparent substrate 14 side, a cover is preferably provided to prevent ultraviolet light from shining on the organic EL element 17. Then, when the seal cap 11 is bonded to the transparent substrate 14, the circuit pattern 12 and the electrode terminals 19 are connected.

In this way, when ultraviolet light is shown from the seal cap side to cure the ultraviolet curing resin seal, there is no need for a cover to protect the organic EL element, and this makes it possible to complete the bonding of the seal cap to the transparent substrate in a short time.

Figure 4:
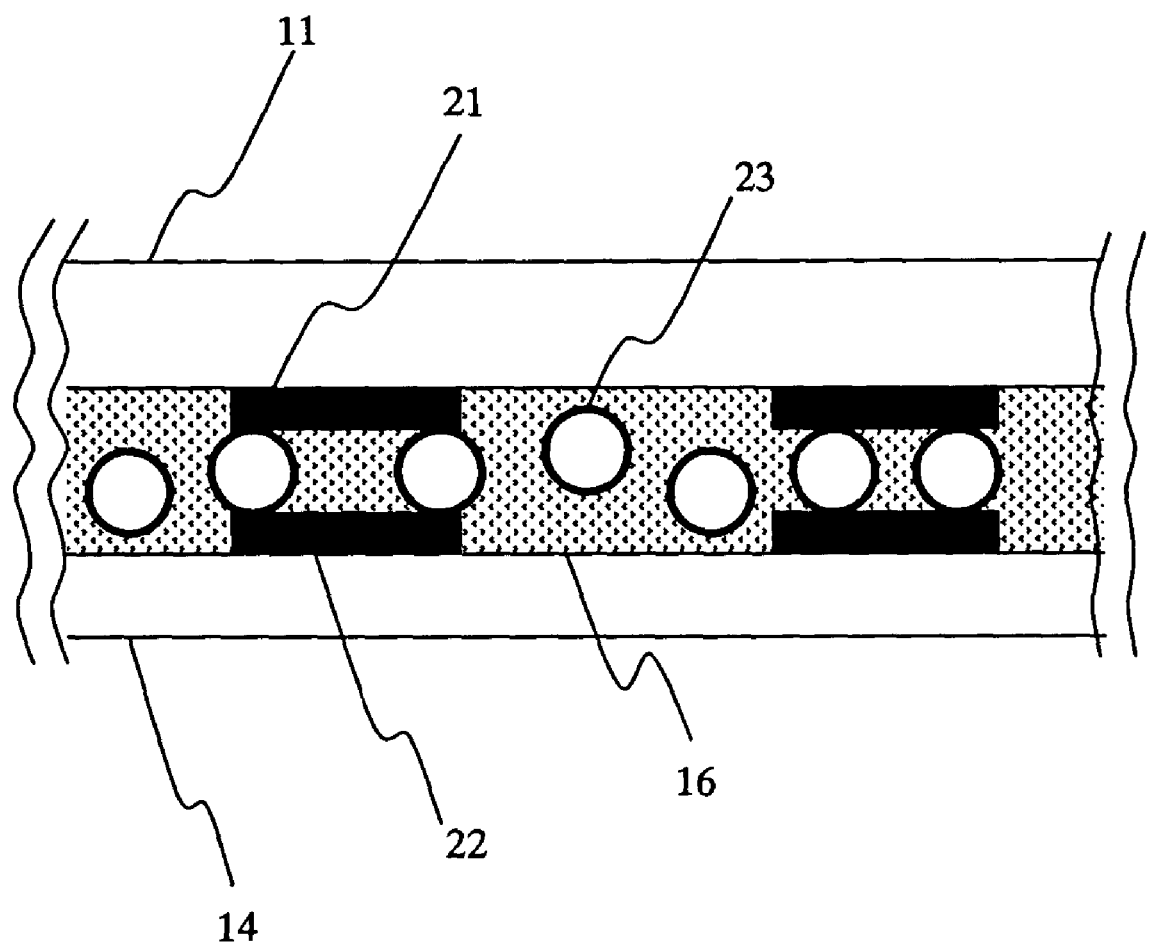
FIG. 4 is a process drawing for describing bonding by an ultraviolet curing resin in the manufacturing method of the organic EL display element of the present invention.

Next, a description will be given for the method of connecting the circuit pattern formed on the seal cap to the electrode terminals of the transparent substrate. FIG. 4 is a drawing for describing a method of making contact between the circuit pattern and the electrode terminals, wherein 11 represents a seal cap, 14 represents a transparent substrate, 16 represents an ultraviolet curing resin seal, 21 represents the circuit pattern of the seal cap, 22 represents the electrode terminals of the transparent substrate, and 23 represents anisotropic conductive particles. The anisotropic conductive particles 23 have a conductive metal coating on a core material. As for the core material, it is possible to use resin beads, silica beads, glass beads, or PVA (polyvinyl alcohol) beads. In particular, PVA beads are preferred. As for the shape, spherical particles having a uniform diameter are preferred. As for the metal coating, preferably the core material is plated with nickel and then coated with an outside shell of gold. The conductive particles may be mixed in a paste in advance or at the time of bonding.

The ultraviolet curing resin seal 16 in which the anisotropic conductive particles 23 are mixed is applied to the portions where the seal cap 11 makes contact with a transparent substrate 14. When the seal cap 11 and the transparent substrate 14 are compressed, the anisotropic conductive particles are inserted between the circuit pattern 21 of the seal cap and the electrode terminals 22 of the transparent substrate, thereby connecting the circuit pattern 21 of the seal cap and the electrode terminals 22 of the transparent substrate. In this state, when ultraviolet light is shone, bonding is carried out while maintaining the connection of both.

Accordingly, when the seal cap and the transparent substrate are bonded by an ultraviolet curing resin seal having anisotropic conductive particles mixed therein, it becomes possible to easily connect the circuit pattern of the seal cap and the electrodes of the transparent substrate without connections made by soldering each electrode terminal of the transparent substrate to the circuit pattern of the seal cap. Further, it is possible to bond the seal cap and the transparent substrate in a short time.

Figure 5A:
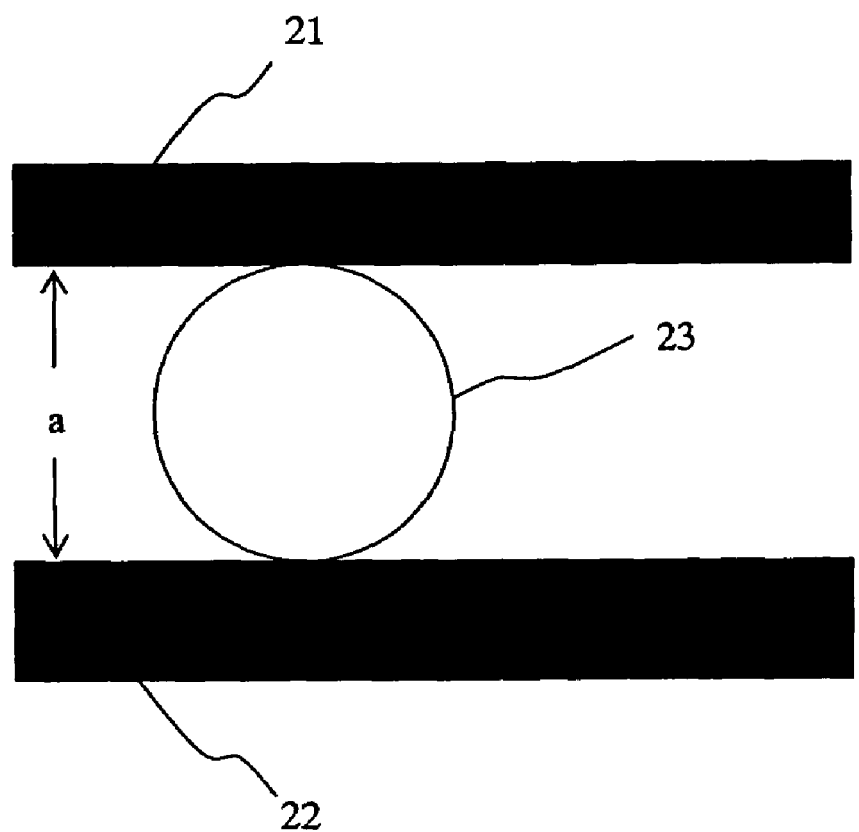
FIGS. 5(a) and 5(b) are process drawings for describing a connection made by anisotropic conductive particles in the manufacturing method of the organic EL display element of the present invention.
Figure 5B:
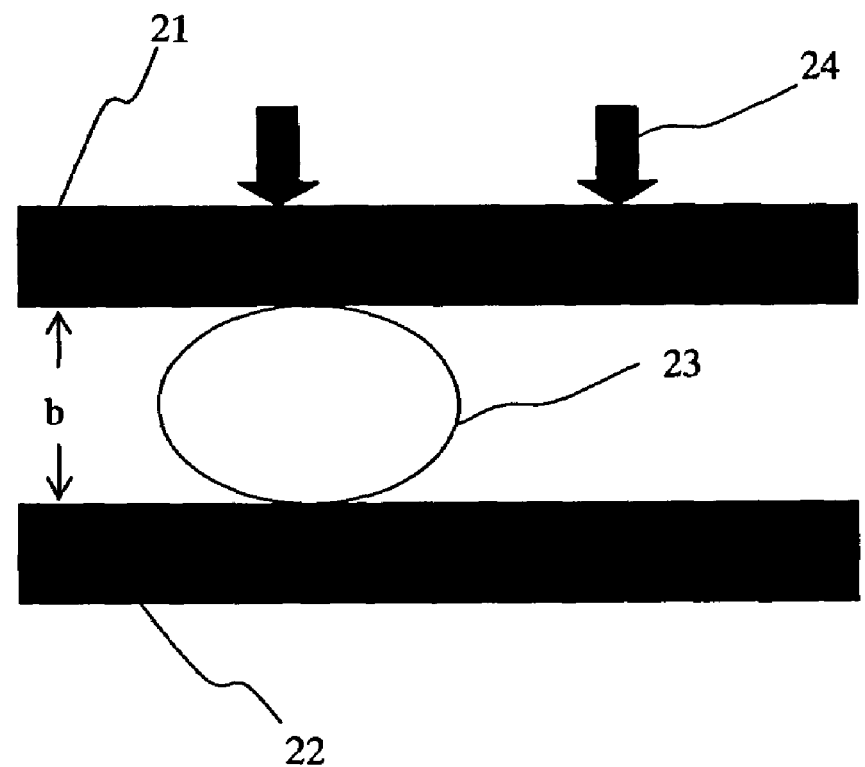

In this regard, a description will now be given for the degree of compression of the seal cap and the transparent substrate. FIGS. 5(a) and 5(b) are drawings for describing the compressibility of the anisotropic conductive particles, wherein 21 represents the circuit pattern of the seal cap, 22 represents the electrode terminals of the transparent substrate, 23 represents anisotropic conductive particles, 24 represents the pressing force. The anisotropic conductive particles 23 mixed in the ultraviolet curing resin seal have spherical shapes (FIG. 5(a)). When the seal cap is bonded to the transparent substrate, there will only be a small contact surface area if the anisotropic conductive particles 23 between the circuit pattern 21 of the seal cap and the electrode terminals 22 of the transparent substrate keep their spherical shapes, and for this reason, the anisotropic conductive particles 23 are preferably compressed by a pushing force capable of deforming the anisotropic conductive particles 23 (FIG. 5(b)).

In this regard, in FIGS. 5(a) and 5(b), if "a" represents the original diameter of the anisotropic conductive particles 23, and if "b" represents the minor axis of the compressed anisotropic conductive particles 23, then the compressibility is given by Equation (1) below.

$$\text{Compressibility} = (a-b)/a \quad (1)$$

In order to create a stable electrical connection between the circuit pattern and the electrode terminals, it is preferred that the anisotropic conductive particles normally be kept in an elastic compression state. Even in the case where the ultraviolet curing resin seal expands due to the absorption of moisture or temperature changes, if the anisotropic conductive particles are in an elastic compression state, then the expansion is followed, and a proper contact pressure is maintained. In the case of PVA beads, when the compressibility is less than 20%, it becomes difficult to follow the expansion of the ultraviolet curing resin seal, and when the compressibility is less than 10%, the contact pressure is small, and this increases the risk of loose contact. Further, when the compressibility is greater than 40%, there is the risk that the nickel plating will peel off the core material, and when the compressibility is greater than 50%, there is a high risk that the core material will be destroyed. From the experimental results described above, a good connection between the circuit pattern of the seal cap and the electrode terminals of the transparent substrate can be obtained when the compressibility of the anisotropic conductive particles is 10~50%. Preferably, the compressibility is set at 20~40% to make it possible to obtain an even better connection.

Accordingly, by applying pressure to the seal cap and the transparent substrate so that the anisotropic conductive particles reach a prescribed compressibility, it is possible to make a good connection between the circuit pattern of the seal cap and the electrode terminals of the transparent substrate.

Figure 6:
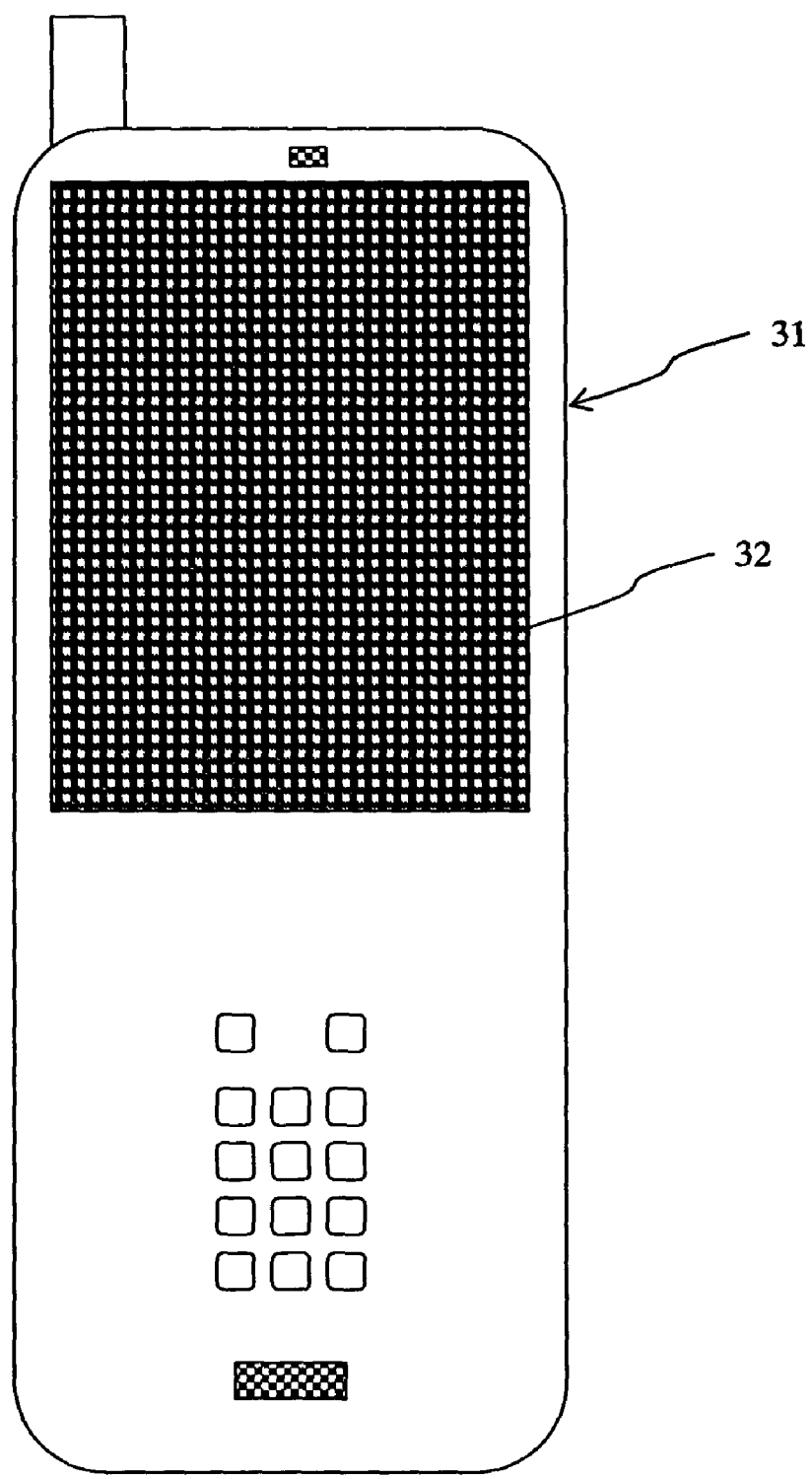
FIG. 6 is a portable information terminal equipped with the organic EL display element of the present invention.

Now, because the organic EL display element manufactured by the method of manufacturing an organic EL display element described above can be made to have a thin thickness, when such organic EL display element is installed in a portable information terminal having a display portion, the body of the portable information terminal can be made thin. Further, in such organic EL display element, because it is possible to form a so-called frameless organic EL display element, it is possible to enlarge the display portion with respect to the body of the portable information terminal. An external view of a portable information terminal equipped with an organic EL display element is shown in FIG. 6. In FIG. 6, 31 represents a portable information terminal, and 32 represents a display portion.

As shown in FIG. 6, the organic EL display element according to the present invention makes it possible to eliminate the so-called frame, and because flexible wiring is connected to the seal cap without using a so-called frame, it is possible to enlarge the display portion 32 of the portable information terminal 31 in the left, right, top and bottom directions of the body of the portable information terminal 31. Further, the thickness of the portable information terminal 31 can be made thin.

As described above, the manufacturing method of the present invention makes it possible to simplify the manufacturing process of organic EL display elements. Further, the organic EL display element manufactured by the manufacturing method of the present invention can be made thin, and the so-called frame can be reduced. Furthermore, a portable information terminal equipped with the organic EL display element of the present invention can be made thin, and the display portion thereof can be enlarged in the left, right, top and bottom directions of the body.

What is claimed is:

1. A method of manufacturing an organic electroluminescent display element, comprising the steps of:
    forming a plurality of organic electroluminescent elements on top of a transparent substrate;
    bonding seal caps made of glass which is transparent to ultraviolet light over the top of an electronic circuit arranged on top of said transparent substrate so as to seal each of said electroluminescent elements; and
    then cutting said transparent substrate around each of said organic electroluminescent elements to form organic electroluminescent display elements wherein an ultraviolet curing resin seal is used in the bonding of said seal caps to said top of said transparent substrate and the bonding of said seal caps to said transparent substrate is carried out by shining ultraviolet light on the ultraviolet curing resin seal from said seal caps side.

2. A method of manufacturing an organic electroluminescent display element, comprising the steps of:
    forming a plurality of organic electroluminescent elements on top of a transparent substrate;
    bonding seal caps provided with electronic circuits to said transparent substrate so as to seal each of said electroluminescent elements; and then
    cutting said transparent substrate around each of said organic electroluminescent elements to form organic electroluminescent display elements, wherein an ultraviolet curing resin seal having anisotropic conductive particles mixed therein is used in the bonding of said seal caps to said transparent substrate, and ultraviolet light is shone on said ultraviolet curing resin seal after said seal caps and said transparent substrate are compressed so that anisotropic conductive particles have a compressibility of 10~50%.

3. The method of manufacturing an organic electroluminescent display element described in claim 2, wherein seal glass transparent to ultraviolet light is used in said seal caps, and the bonding of said seal caps to said transparent substrate is carried out by shining ultraviolet light on the ultraviolet curing resin seal through said seal caps.

* * * * *

UNITED STATES PATENT AND TRADEMARK OFFICE
CERTIFICATE OF CORRECTION

| | |
|---|---|
| PATENT NO. | : 7,125,307 B2 |
| APPLICATION NO. | : 10/620222 |
| DATED | : October 24, 2006 |
| INVENTOR(S) | : Makoto Takamura |

It is certified that error appears in the above-identified patent and that said Letters Patent is hereby corrected as shown below:

Title Page,
Item (30) Foreign Application Priority Data:
Delete "Application No. JP 2002-206020, July 15, 2002"

Signed and Sealed this

Sixth Day of February, 2007

JON W. DUDAS
*Director of the United States Patent and Trademark Office*